United States Patent
Huang et al.

(10) Patent No.: US 6,383,945 B1
(45) Date of Patent: May 7, 2002

(54) HIGH SELECTIVITY PAD ETCH FOR THICK TOPSIDE STACKS

(75) Inventors: Jiahua Huang, San Jose; Jeffrey A. Shields, Sunnyvale; Allison Holbrook, San Jose, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/430,465

(22) Filed: Oct. 29, 1999

(51) Int. Cl.[7] ............................................. H01L 21/203
(52) U.S. Cl. ....................... 438/734; 438/713; 438/714; 438/723; 438/724; 438/701; 438/725; 438/739; 438/740; 430/5
(58) Field of Search ............................. 430/5; 438/723, 438/724, 725, 714, 713, 701, 734, 739, 740

(56) References Cited

U.S. PATENT DOCUMENTS

| | | | | |
|---|---|---|---|---|
| 4,423,547 A | * | 1/1984 | Farrar et al. ................... | 29/571 |
| 5,433,823 A | * | 7/1995 | Cain ........................ | 156/662.1 |
| 5,637,904 A | * | 6/1997 | Zettler ........................ | 257/417 |
| 5,824,233 A | * | 10/1998 | Zettler ............................ | 216/2 |
| 5,883,001 A | * | 3/1999 | Jin et al. ..................... | 438/624 |
| 5,960,306 A | * | 9/1999 | Hall et al. .................. | 438/612 |
| 6,001,538 A | * | 12/1999 | Chen et al. .................. | 430/316 |

OTHER PUBLICATIONS

"Effect of Film Type On Isotropic Etch Activation Energy"; Proc.–Elect. Soc. (1998'); Abstract; Duton.*

* cited by examiner

*Primary Examiner*—George Goudreau
(74) *Attorney, Agent, or Firm*—LaRiviere, Grubman & Payne, LLP

(57) ABSTRACT

An improved etch of thick protective topside stack films, which cover metal pads of a semiconductor device. The invention uses a downstream plasma isotropic etch to etch the topside stack film. In one embodiment, the downstream plasma isotropic etch is used to etch only part of the topside stack films. A subsequent anisotropic oxide plasma etch is used to etch the remaining topside stack film to the metal pads. In another embodiment, the downstream plasma isotropic etch is used to etch completely through the topside stack films to the metal pad. The invention allows the etching through topside stack films greater than 5 microns.

4 Claims, 7 Drawing Sheets

HIGH SELECTIVITY PAD ETCH FOR THICK TOPSIDE STACKS

FIELD OF THE INVENTION

The present invention relates to the manufacture of semiconductor chips. More specifically, the present invention relates to a method of etching protective topside stack film to expose metal bonding pads.

BACKGROUND OF THE INVENTION

One of the final steps in manufacturing a semiconductor device involves etching large openings in a thick protective topside stack film to expose metal bonding pads for electrical connections to the outside world. This step is referred to as a pad etch. FIGS. 1a and 1b illustrate a prior art pad etch. In FIG. 1a a semiconductor device 10 comprises a device layer 23 under an interlayer dielectric 11 with an upper surface with a metal pad 12. A thin titanium nitride (TiN) layer 14 covers an upper surface of the metal pad 12. An oxide film 16 covers the upper surface of the substrate and thin titanium nitride layer 14. A nitride film 18 covers the upper surface of the oxide film 16. The oxide film 16 and the nitride film 18 make up a protective topside stack film. Various combinations of oxide film and nitride films may be used in the protective topside stack film. In the prior art a resist layer 20 is placed over the topside stack film and masked to provide an aperture 22 in the resist layer 20 over the metal pad 12. The semiconductor device 10 is subjected to an anisotropic oxide plasma etch, which in the prior art is generally a fluorine based high power anisotropic oxide plasma etch. FIG. 1b illustrates the semiconductor device 10 after it is undergone the anisotropic oxide plasma etch. The anisotropic plasma etch etches an aperture through the oxide film 16, nitride film 18, and titanium nitride layer 14. An etch with straight vertical side walls is characteristic of an anisotropic oxide plasma etch.

The prior art anisotropic oxide plasma pad etches had a low throughput due to the thick oxide and nitride films. Long etch times in high power etching caused resist damage (burning and erosion). The prior art anisotropic oxide plasma pad etches had a low selectivity to resist of approximately 1:1 for nitride to resist and 2:1 for oxide to resist, as shown by the etching of the resist layer 20 between FIGS. 1a and 1b The low selectivity to resist of the pad etch process requires the resist layer to be as thick as possible and the topside stack film to be as thin as possible. The thickness of the topside stack film is limited to about 2.5 microns or less in thickness due to the low selectivity to resist of the pad etch process.

It is desirable to etch topside stack films greater than 2.5 microns using a thin resist layer.

BRIEF SUMMARY OF THE INVENTION

It is an object of the invention to provide a pad etch process that is able to etch through a topside stack film that is greater than 2.5 microns.

It is another object of the invention to provide a pad etch process that has a faster throughput and less resist damage.

Accordingly, the foregoing objects are accomplished by etching a topside stack film with an isotropic etch that has a very good selectivity to resist.

Other features of the present invention are disclosed or apparent in the section entitled: "DETAILED DESCRIPTION OF THE INVENTION."

BRIEF DESCRIPTION OF DRAWINGS

For a fuller understanding of the present invention, reference is made to the accompanying drawings wherein.

Figure 1A:
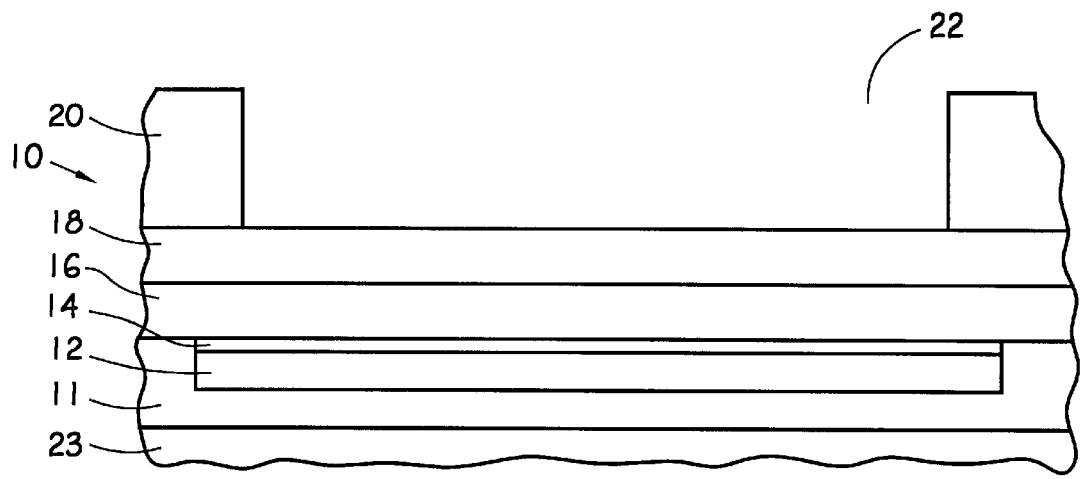
FIGS. 1a and 1b are cross sectional views device undergoing an anisotropic etch used in the prior art.
Figure 1B:

Reference numbers refer to the same or equivalent parts of the present invention throughout the several Figures of the drawing.

DETAILED DESCRIPTION OF THE INVENTION AND BEST MODE OF THE INVENTION

Figure 2:
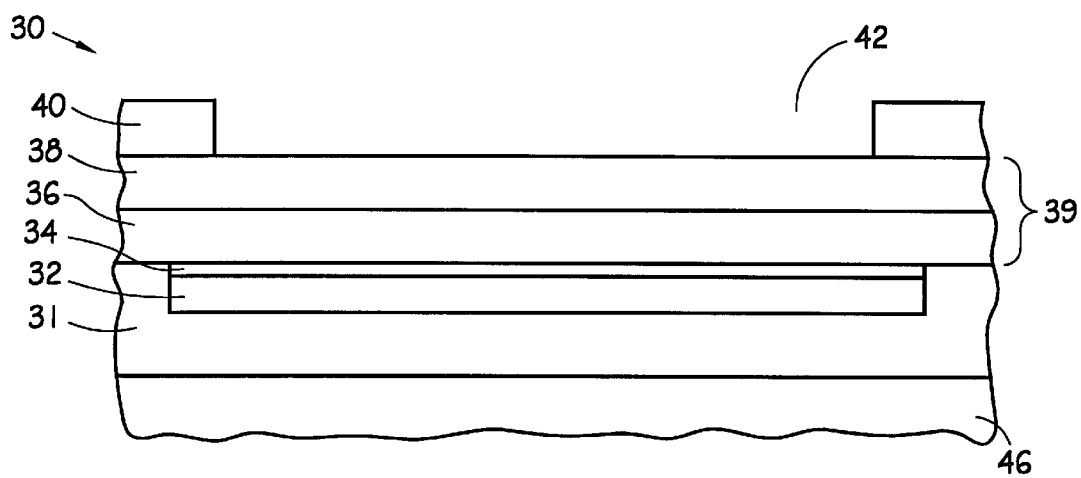
FIG. 2 is a cross sectional view of a semiconductor device used in the preferred embodiment of the invention.

FIG. 2 is a cross sectional view of a semiconductor device 30, which comprises a device layer 46 under an interlayer dielectric 31 with an upper surface with a metal pad 32, such as an aluminum pad, used in a preferred embodiment of the invention. A thin titanium nitride (TiN) layer 34 covers an upper surface of the metal pad 32 to provide an antireflective coating. An oxide film 36 covers the upper surface of the interlayer dielectric 31 and thin titanium nitride layer 34. A nitride film 38 covers the upper surface of the oxide film 36. The oxide film 36 and the nitride film 38 make up a protective topside stack film 39. Various combinations of oxide film and nitride films may be used in the protective topside stack film 39. A resist layer 40 is placed over the topside stack film 39 and etched to provide an aperture 42 in the resist layer 40 over the metal pad 32. In the preferred embodiment of the invention, the resist layer 40 may be thinner and the topside stack film 39 may be thicker than in the prior art.

Figure 3:
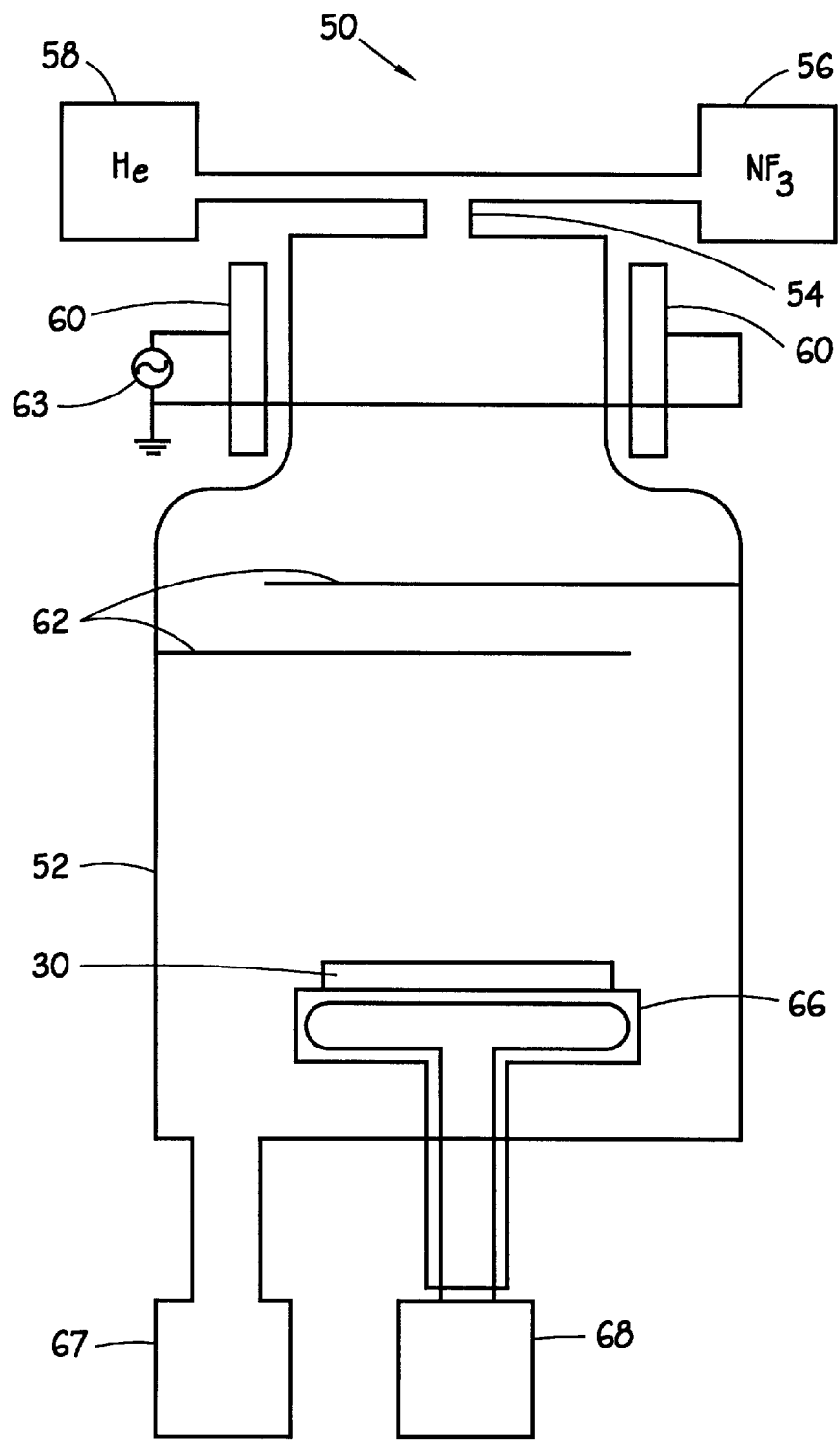
FIG. 3 is a schematic view of a downstream plasma isotropic etching device used in the preferred embodiment of the invention.

The semiconductor device 30 is then placed in an isotropic etch device. FIG. 3 is a schematic view of a downstream plasma isotropic etching device 50, which is used in the preferred embodiment of the invention. In this example the etching device comprises a quartz chamber 52 and an infeed line 54 connected to the top of the quartz chamber 52. The infeed line 54 splits into two branches where the first branch is connected to a nitrogen trifluoride $NF_3$ source 56 and the second branch is connected to a helium He source 58. A cathode and anode set 60, connected to a radio frequency power supply 63, is located near the top of the quartz chamber 52. Baffles 62 are located within the quartz chamber 52 below the cathode and anode set 60. A chuck 66 is located in the quartz chamber 52 below the baffles 62. A thermal control 68 is in thermal connection with the chuck 66. A vacuum system 67 is connected to the chamber 52 near the bottom of the quartz chamber 52.

The semiconductor device 30 is placed on the chuck 66. The thermal control 68 heats the semiconductor device 30 to a temperature of between 60° to 90° C. The infeed line 54 provides nitrogen trifluoride NF$_3$ with a concentration between 200 to 400 sccm and helium with a concentration between 200 to 400 sccm to the chamber 52. The radio frequency power supply 63 supplies radio frequency (RF) power between 400 and 800 Watts to the cathode and anode set 60 to create a plasma between the cathode and anode set 60. The vacuum system 67 maintains the pressure between 1000 to 2000 milliTorr. The plasma flows through the baffles 62 to the semiconductor device 30. The arrangement causes the semiconductor device 30 to be exposed to the plasma downstream from where the plasma is created. As a result, the semiconductor device is subjected to an isotropic plasma etch with a nitride to resist selectivity greater than about 60:1 and an oxide to resist selectivity greater than about 30:1. In a preferred embodiment, the resist is not etched at all during the isotropic etch.

Figure 4:
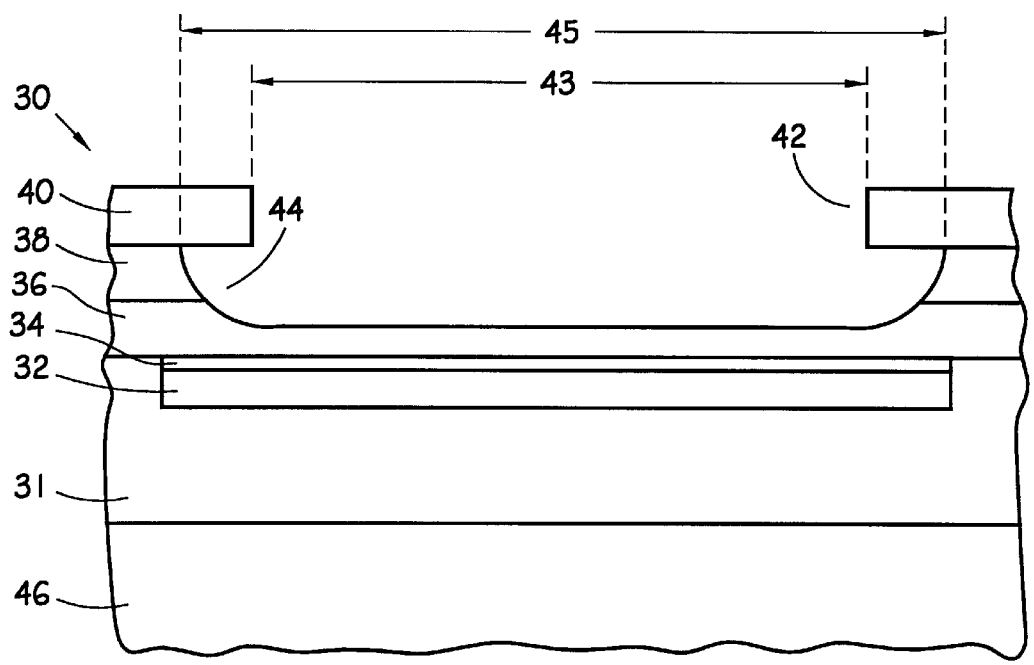
FIG. 4 is a cross sectional view of the semiconductor device shown in FIG. 2 after it has undergone isotropic etching.

FIG. 4 is a cross sectional view of the semiconductor device 30 after it is removed from the downstream plasma isotropic etch device 50. The isotropic etch device 50 has etched an opening 44 through the nitride film 38 and into the oxide film 36. Since the etch is isotropic, the top diameter 45 of the opening 44 is greater than the diameter 43 of the aperture 42 in the resist layer 40, so that the opening undercuts the resist layer 40. In addition, the isotropic etch causes non-vertical walls so that the top diameter 45 of the opening 44 is greater than the bottom diameter of the opening 44. Since the isotropic etch is highly selective, very little or none of the resist layer 40 has been etched away.

Figure 5:
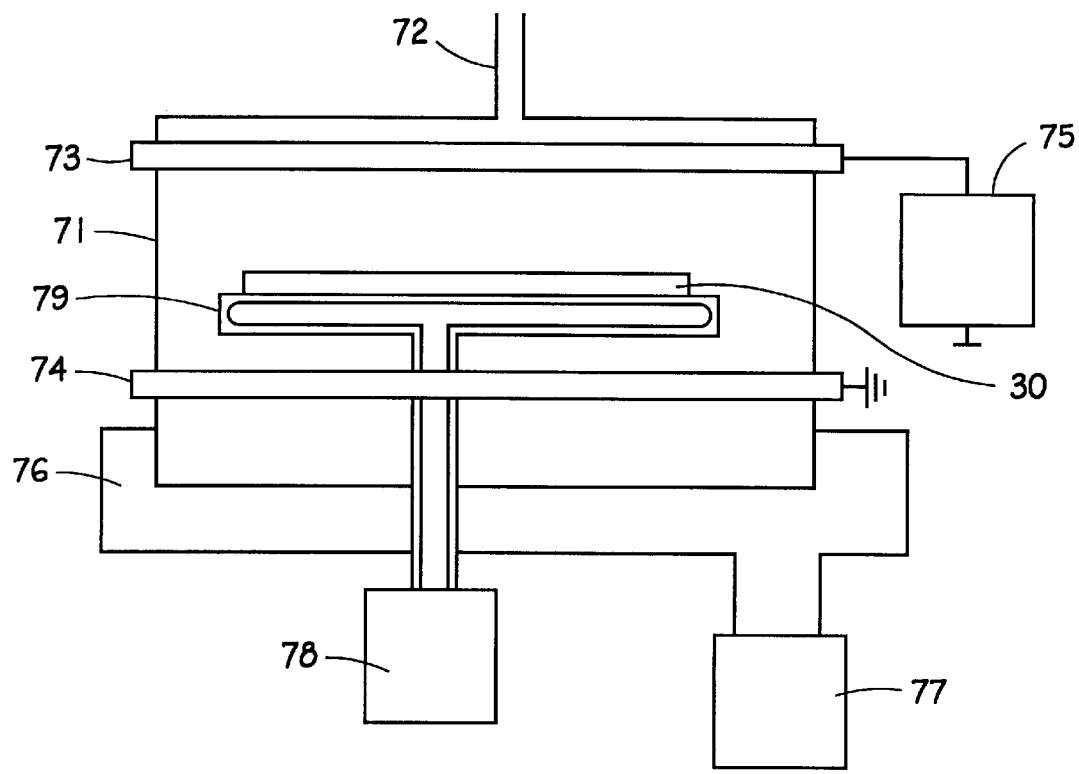
FIG. 5 is a schematic view of an anisotropic etching device used in the preferred embodiment of the invention.

The semiconductor device 30 is then placed in a conventional anisotropic oxide plasma etching device. FIG. 5 is a schematic view of an anisotropic etching device 70 used in this embodiment of the invention. The anisotropic etching device 70 comprises a chamber 71 and an infeed line 72 connected to the top of the chamber 71. The infeed line 72 is connected to a fluorine containing gas source, which supplies a fluorine containing gas, such as carbon tetrafluoride CF$_4$, trifluoromethane CHF$_3$, and sulfur hexafluoride SF$_6$, with possible additions of argon Ar, oxygen O$_2$, helium He, or nitrogen N. A ring shaped cathode 73 surrounds and is located near the top of the chamber 71. A ring shaped anode 74 surrounds and is located near the bottom of the chamber 71. The cathode 73 is electrically connected to a radio frequency power supply 75, while the anode 74 is grounded. The chamber 71 is mounted on a base 76, which is connected to a vacuum system 77. A thermal control system 78 is connected to a chuck 79, which holds the semiconductor device 30 between the cathode 73 and anode 74.

In operation, the fluorine containing gas source is provided to the chamber 71 through the infeed line 72. The radio frequency power supply 75 provides radio frequency power between about 1000 to 1500 watts to the cathode 73 to convert the fluorine containing gas to a plasma. Since the semiconductor device 30 is placed between the cathode 73 and anode 74, the semiconductor device 30 is in the area of plasma generation, causing the anisotropic etching.

Figure 6:
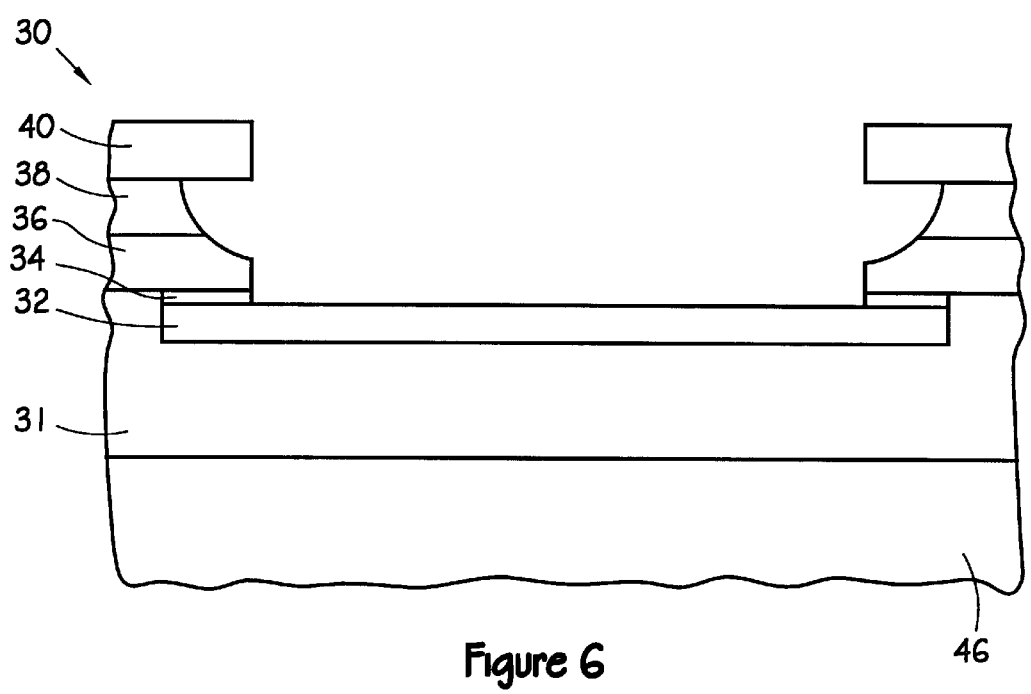
FIG. 6 is a cross sectional view of the semiconductor device shown in FIG. 4 after it has undergone anisotropic etching.

FIG. 6 is a cross sectional view of the semiconductor device 30 after it is subjected to the anisotropic etch. The anisotropic etch extended the opening to the metal pad 32, where the extended part of the opening has vertical walls. Since the isotropic etch has less selectivity, much of the resist layer 40 has been etched away. The resist layer 40 is subsequently removed and an electrical wire is then electrically connected to the metal pad 32.

Since the isotropic etch reduces the etching of the resist layer, the inventive process is able to etch topside stack films greater than 5 microns and up to 10 microns thick. Since the isotropic etch uses a downstream plasma and has a lower radio frequency power, less damage occurs to the device. Since two separate etch chambers are used serially, the ultimate throughput of the manufacturing line could be increased, since the etch time in each chamber could be adjusted to reach the highest productivity.

Figure 7:
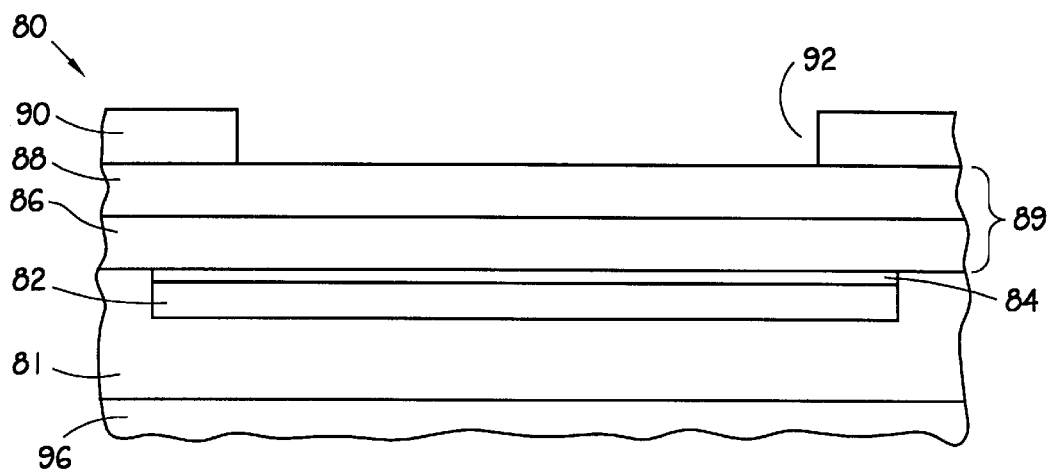
FIG. 7 is a cross sectional view of a semiconductor device used in another embodiment of the invention.

FIG. 7 is a cross sectional view of a semiconductor device 80 used in another embodiment of the invention. The semiconductor device 80 comprises a device layer 96 under an interlayer dielectric 81 with an upper surface with a metal pad 82. MOSFET devices may be embedded in the device layer 96. A thin titanium nitride layer 84 covers an upper surface of the metal pad 82. An oxide film 86 covers the upper surface of the substrate and thin titanium nitride layer 84. A nitride film 88 covers the upper surface of the oxide film 86. The oxide film 86 and the nitride film 88 make up a protective topside stack film 89. Various combinations of oxide film and nitride films may be used in the protective topside stack film 89. A resist layer 90 is placed over the topside stack film 89 and etched to provide an aperture 92 in the resist layer 90 over the metal pad 82. In the this embodiment of the invention, the resist layer 90 may be even thinner than the previous embodiment and the topside stack film 89 may be thicker than in the prior art.

In this embodiment of the invention, only an isotropic etch is used. The semiconductor device 80 is placed in a isotropic etch device, such as the downstream plasma isotropic etch device 50 shown in FIG. 3 and described above in the previous embodiment.

The semiconductor device 80 is placed on the chuck 66. The thermal control 68 heats the semiconductor device 80 to a temperature of between 60° to 90° C. The radio frequency power supply 63 supplies radio frequency (RF) power between 400 and 800 watts to the cathode and anode set 60. The infeed line 54 provides nitrogen trifluoride NF$_3$ with a concentration between 200 to 400 sccm and helium with a concentration between 200 to 400 sccm to the chamber 52. The vacuum system 67 maintains the pressure between 1000 to 2000 milliTorr. As a result, the semiconductor device is subjected to an isotropic plasma etch with a nitride to resist selectivity greater than about 60:1 and an oxide to resist selectivity greater than about 30:1. The semiconductor device 80 undergoes an isotropic etch for a longer time than the device in the previous embodiment.

Figure 8:
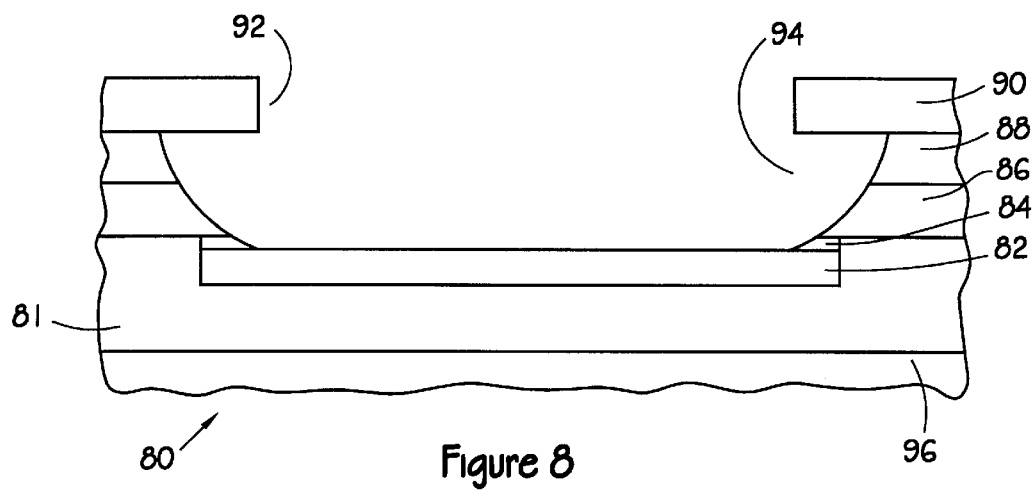
FIG. 8 is a cross sectional view of the semiconductor device shown in FIG. 7 after it has undergone isotropic etching.

FIG. 8 is a cross sectional view of the semiconductor device 80 after it has undergone the isotropic etch. The isotropic etch has etched an opening 94 completely through the nitride film 88, the oxide film 86, and the thin titanium nitride layer 84. Since the etch is isotropic, the top diameter of the opening 94 is greater than the diameter of the aperture 92 in the resist layer 90, so that the opening undercuts the resist layer 90. In addition, the isotropic etch causes non-vertical walls so that the top diameter of the opening 94 is greater than the bottom diameter of the opening. Since the isotropic etch is highly selective, very little of the resist layer 90 has been etched away.

Since the isotropic etch reduces the etching of the resist layer, the inventive process is able to etch topside stack films greater than 5 microns and up to 10 microns thick. Since the isotropic etch uses a lower radio frequency power, less damage occurs to the device. Since the isotropic etch is used for the entire metal pad etching process, the resist layer may be kept thin. This embodiment also allows a shorter etch time. The resist layer 90 is subsequently removed and an electrical wire is then connected to the metal pad 82.

Information as herein shown and described in detail is fully capable of attaining the above-described object of the invention, it is understood that it is the presently preferred embodiment of the present invention and is thus representative of the subject matter which is broadly contemplated by the present invention, that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more". All structural and functional equivalents to the elements of the above-described preferred embodiment that are known or later come to be known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for".

We claim:

1. A method for providing access to a metal pad on a semiconductor device, comprising:

forming a topside stack film having a thickness of approximately 5 microns to approximately 10 microns over the semiconductor device, said film having at least one oxide layer adjacent the metal pad and at least one nitride layer;

forming a resist layer over the topside stack film;

creating an aperture through the resist layer over the metal pad;

placing the semiconductor device in a downstream plasma isotropic etch device;

heating the semiconductor device to a temperature of approximately 60° C. to approximately 90° C.;

isotropically etching through the resist layer with a radio frequency power of approximately 400 watts to approximately 800 watts the at least one nitride layer of the topside stack film under the aperture;

placing the semiconductor device in an anisotropic plasma etch device; and anisotropically etching with a radio frequency power of approximately 1,000 watts to approximately 1,500 watts the topside stack film to at least the level of the metal pad.

2. The method as in claim 1 wherein the isotropic etch is performed with $NF_3$ at a concentration between approximately 200 to approximately 400 sccm, helium with a concentration between approximately 200 to approximately 400 sccm, and a vacuum between approximately 1,000 to approximately 2,000 milliTorr.

3. The method as in claim 1 wherein the anisotropic etch is performed with a gas selected from the group consisting of $CF_4$, $CHF_3$ and $SF_6$.

4. A method for providing access to a metal pad on a semiconductor device, comprising:

forming a topside stack film having a thickness of approximately 5 microns to approximately 10 microns over the semiconductor device, said film having at least one oxide layer adjacent the metal pad and at least one nitride layer;

forming a resist layer over the topside stack film;

creating an aperture through the resist layer over the metal pad;

placing the semiconductor device in a downstream plasma isotropic etch device;

heating the semiconductor device to a temperature of approximately 60° C. to approximately 90° C.;

isotropically etching through the resist layer with a radio frequency power of approximately 400 watts to approximately 800 watts with $NF_3$ at a concentration between approximately 200 to approximately 400 sccm, helium with a concentration between approximately 200 to approximately 400 sccm, and a vacuum between approximately 1,000 to approximately 2,000 milliTorr the at least one nitride layer of the topside stack film under the aperture;

placing the semiconductor device in an anisotropic plasma etch device; and anisotropically etching with a radio frequency power of approximately 1,000 watts to approximately 1,500 watts with a gas selected from the group consisting of $CF_4$, $CHF_3$ and $SF_6$ the topside stack film at least to the level of the metal pad.

* * * * *